US009269451B2

(12) United States Patent
Ellis

(10) Patent No.: US 9,269,451 B2
(45) Date of Patent: *Feb. 23, 2016

(54) STORAGE DEVICE AND METHOD FOR PERFORMING A SELF-REFRESH OPERATION

(71) Applicant: SanDisk Technologies Inc., Plano, TX (US)

(72) Inventor: Robert W. Ellis, Phoenix, AZ (US)

(73) Assignee: SanDisk Technologies Inc., Plano, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/532,611

(22) Filed: Nov. 4, 2014

(65) Prior Publication Data

US 2015/0348642 A1   Dec. 3, 2015

Related U.S. Application Data

(63) Continuation of application No. 14/287,988, filed on May 27, 2014, now Pat. No. 8,908,443.

(51) Int. Cl.
G11C 11/34 (2006.01)
G11C 16/34 (2006.01)
G11C 11/56 (2006.01)

(52) U.S. Cl.
CPC ........ G11C 16/3418 (2013.01); G11C 11/5628 (2013.01); G11C 11/5642 (2013.01); *G11C 16/3431* (2013.01)

(58) Field of Classification Search
CPC ............... G11C 16/10; G11C 16/3418; G11C 11/5628; G11C 11/5642; G11C 11/3431
USPC ........................................... 365/185.25, 222
See application file for complete search history.

(56) References Cited

U.S. PATENT DOCUMENTS

| RE42,397 | E | 5/2011 | Ban et al. |
|---|---|---|---|
| RE42,443 | E | 6/2011 | Ban et al. |
| 2008/0219075 | A1* | 9/2008 | Ito .................. G11C 7/1078 365/222 |
| 2010/0312971 | A1 | 12/2010 | Moallem et al. |
| 2012/0151299 | A1 | 6/2012 | Suh |
| 2012/0254519 | A1 | 10/2012 | Ellis |
| 2013/0155081 | A1 | 6/2013 | Khodorkovsky et al. |
| 2014/0153350 | A1 | 6/2014 | Boehm et al. |

FOREIGN PATENT DOCUMENTS

| JP | 5298988 B2 | 9/2013 |
|---|---|---|
| WO | WO 2013/147844 | 10/2013 |

OTHER PUBLICATIONS

Office Action for U.S. Appl. No. 14/287,988 dated Jul. 8, 2014, 15 pages.
Notice of Allowance for U.S. Appl. No. 14/287,988 dated Oct. 30, 2014, 7 pages.

* cited by examiner

*Primary Examiner* — Fernando Hidalgo
(74) *Attorney, Agent, or Firm* — Brinks Gilson & Lione

(57) ABSTRACT

A storage device and method for performing a self-refresh operation are disclosed. In one embodiment, a storage device determines that the self-refresh operation needs to be performed. In response to that determination, the storage device performs the self-refresh operation by reading data from the memory and writing the data back to the memory without transferring the data outside of the storage device.

30 Claims, 8 Drawing Sheets

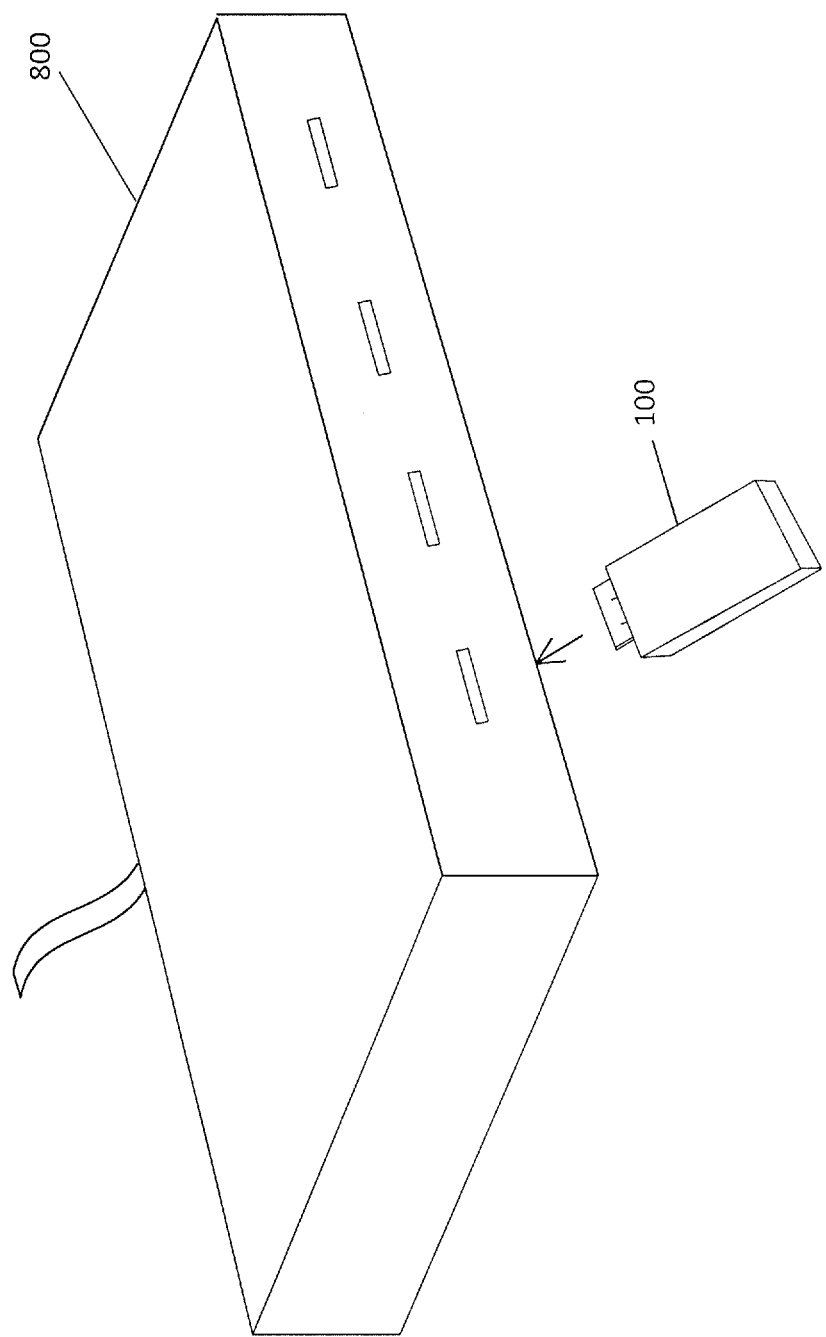

STORAGE DEVICE AND METHOD FOR PERFORMING A SELF-REFRESH OPERATION

CROSS-REFERENCE TO RELATED APPLICATION

This application is a continuation of U.S. patent application Ser. No. 14/287,988, filed May 27, 2014, which is hereby incorporated by reference.

BACKGROUND

Many modern consumer-grade storage devices, such as universal serial bus (USB) flash drives, incorporate multi-level cell (MLC) NAND devices as a storage medium in order to increase the storage capacity of the devices by increasing the amount of information that can be stored per cell. For example, some MLC memories store two-bits per cell, providing four analog levels (typically using a floating gate FET)) or three-bits per cell, providing eight analog levels (sometimes referred to as a three-level cell (TLC)). Additionally, the geometry of NAND cells is constantly being reduced in size (known as die shrink) in order to increase the densities of these devices.

A negative consequence of this increase in density is that data retention (the amount of time a memory cell will hold its data without being refreshed) is drastically reduced. This can especially be a problem for USB devices when used for long-term storage of data (e.g., photos). Because these devices effectively become "read-mostly" or "read-only" devices, there is not much, if any, opportunity to refresh the stored data, which can result in the stored data becoming unreadable over time.

A typical user may learn of this data retention problem only after trying to read data and getting an error indicating that the data is un-readable. Sophisticated users may recognize this problem in advance and either backup the stored data on a secondary device or manually refresh the stored data on the memory device by copying the data off of the memory device and onto a host (e.g., a computer) and then re-writing the data from the host back onto the memory device. However, this refreshing process may not refresh all of the data on the memory device, such as important file indexes and meta data that is normally not seen by the end user. So, even if a user is sophisticated enough to know that data stored on the memory device should be refreshed, the refreshing process may be inconvenient for the user and may not even be complete. Also, the user would need to remember to perform this manual refresh process, which the user may forget about if the memory device is treated as a long-term storage device that is not used very often.

More-sophisticated storage devices, such as solid-state drives (SSDs), can contain an operating mode that monitors the error rates and data retention characteristics of the drive but, in most cases, require some host write or read activity to trigger the measurements that would trigger refreshing portions of the drive.

OVERVIEW

Embodiments of the present invention are defined by the claims, and nothing in this section should be taken as a limitation on those claims.

By way of introduction, the below embodiments relate to storage device and method for performing a self-refresh operation. In one embodiment, a storage device is provided with a memory and a controller. In response to determining that the self-refresh operation needs to be performed, the storage device performs the self-refresh operation by reading data from the memory and writing the data back to the memory without transferring the data outside of the storage device. Other embodiments are possible, and each of the embodiments can be used alone or together in combination. Various embodiments will now be described with reference to the attached drawings.

BRIEF DESCRIPTION OF THE DRAWINGS

FIG. 8 is an illustration of a docketing station that can be used with an embodiment.

DETAILED DESCRIPTION OF EMBODIMENTS

The following embodiments provide a storage device that performs a self-refresh operation. In response to the storage device determining that a refresh of stored data is needed, the storage device reads data from the memory and writes the data back to the memory without transferring the data outside of the storage device. Accordingly, the data in the storage device can be refreshed without requiring a host (e.g., a computer) to perform read and write operations to the storage device. The host would only need to provide a power source, and devices that provide power but do not read/write data (such a USB power hub or docketing station) can be used to provide the power needed for a self-refresh operation. Before turning to these and other embodiments, the following paragraphs provide a discussion of an exemplary storage device that can be used with these embodiments. Of course, this is just an example, and other suitable types of storage devices can be used.

Figure 1:
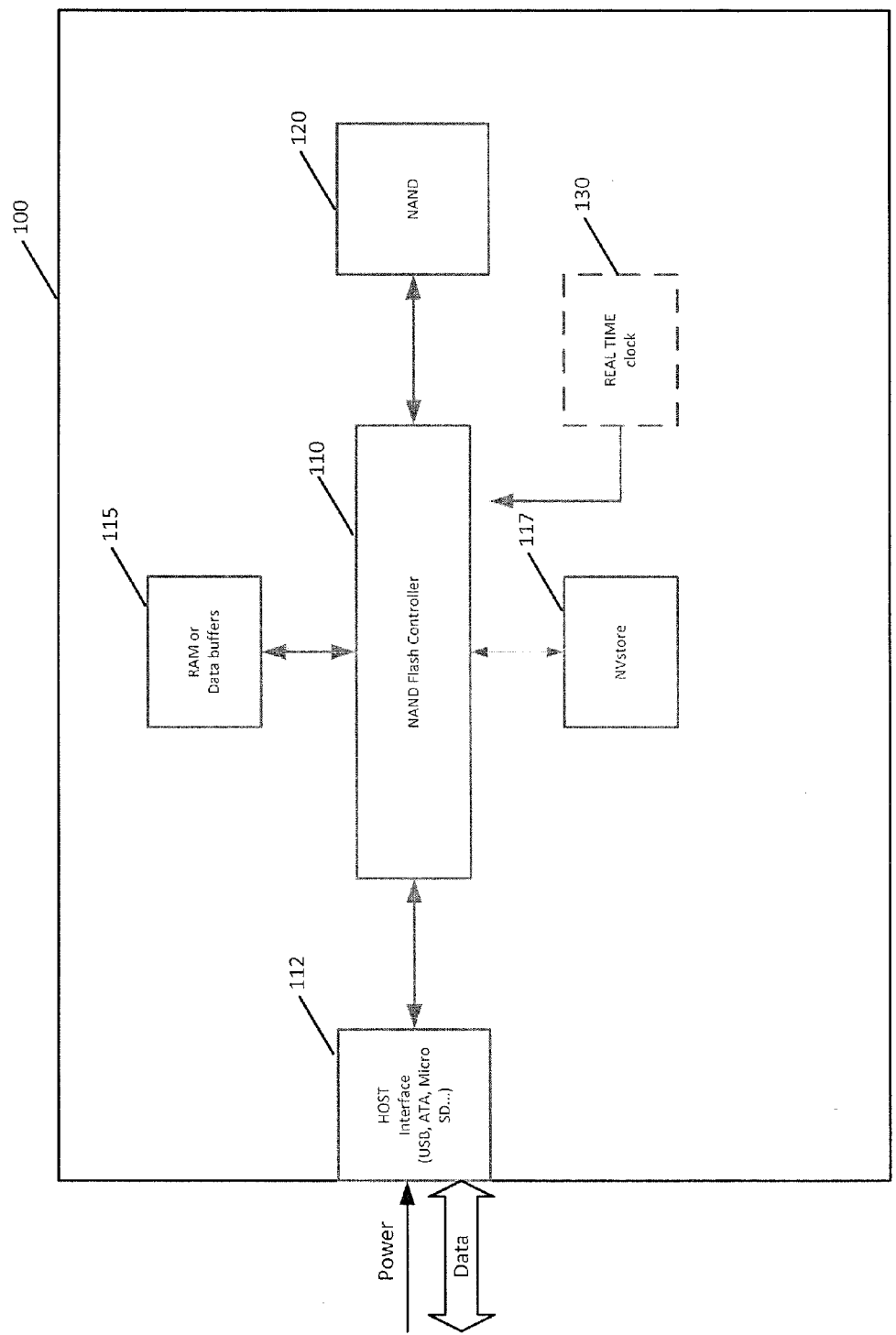
FIG. 1 is a block diagram of a storage device of an embodiment.

Turning now to the drawings, FIG. 1 is an illustration of a storage device 100 of an embodiment. The storage device 100 can take any suitable form, including, but not limited to, a handheld, removable memory device (such as a Secure Digital (SD) memory card, a microSD memory card, a Compact Flash (CF) memory card, or a universal serial bus (USB) device) or a solid state drive (SSD) (e.g., an iNAND™ eSD/eMMC embedded flash drive by SanDisk Corporation), for example. A host can also take any suitable form, such as, but not limited to, a mobile phone, a tablet computer, a digital media player, a game device, a personal digital assistant (PDA), a mobile (e.g., notebook, laptop) personal computer (PC), a book reader, hub device, or charging station, for example. The storage device 100 can be removable or embedded in a host.

As illustrated in FIG. 1, a storage device 100 of one embodiment comprises a controller 110 and a non-volatile memory 120. In this particular embodiment, the controller 110 takes the form of a NAND Flash controller, and the non-volatile memory 120 takes the form of a NAND memory; however, any suitable memory technology can be used. The non-volatile memory 120 can be one-time programmable, few-time programmable, or many-time programmable; can use single-level cell (SLC), multiple-level cell (MLC), triple-level cell (TLC), or other memory technologies, now known or later developed; and can be a two-dimensional memory or a three-dimensional memory.

The storage device 110 also comprises a host interface 112 for placing the storage device 100 operatively in communication with a host. As used herein, the phrase "operatively in communication with" could mean directly in communication with or indirectly in (wired or wireless) communication with through one or more components, which may or may not be shown or described herein. The host interface 112 can take any suitable form, such as, but not limited to, a USB interface, an ATA interface, a microSD interface, an eMMC interface, and a UFS interface. The host interface 112 has the physical and electrical connectors that allow a host to provide power to the storage device 100 and also to communicate data to and from the storage device 100. As will be explained in more detail below, some hosts (such as a USB hub or charging station) may only provide power to the storage device 100 without data transfer.

Figure 2:
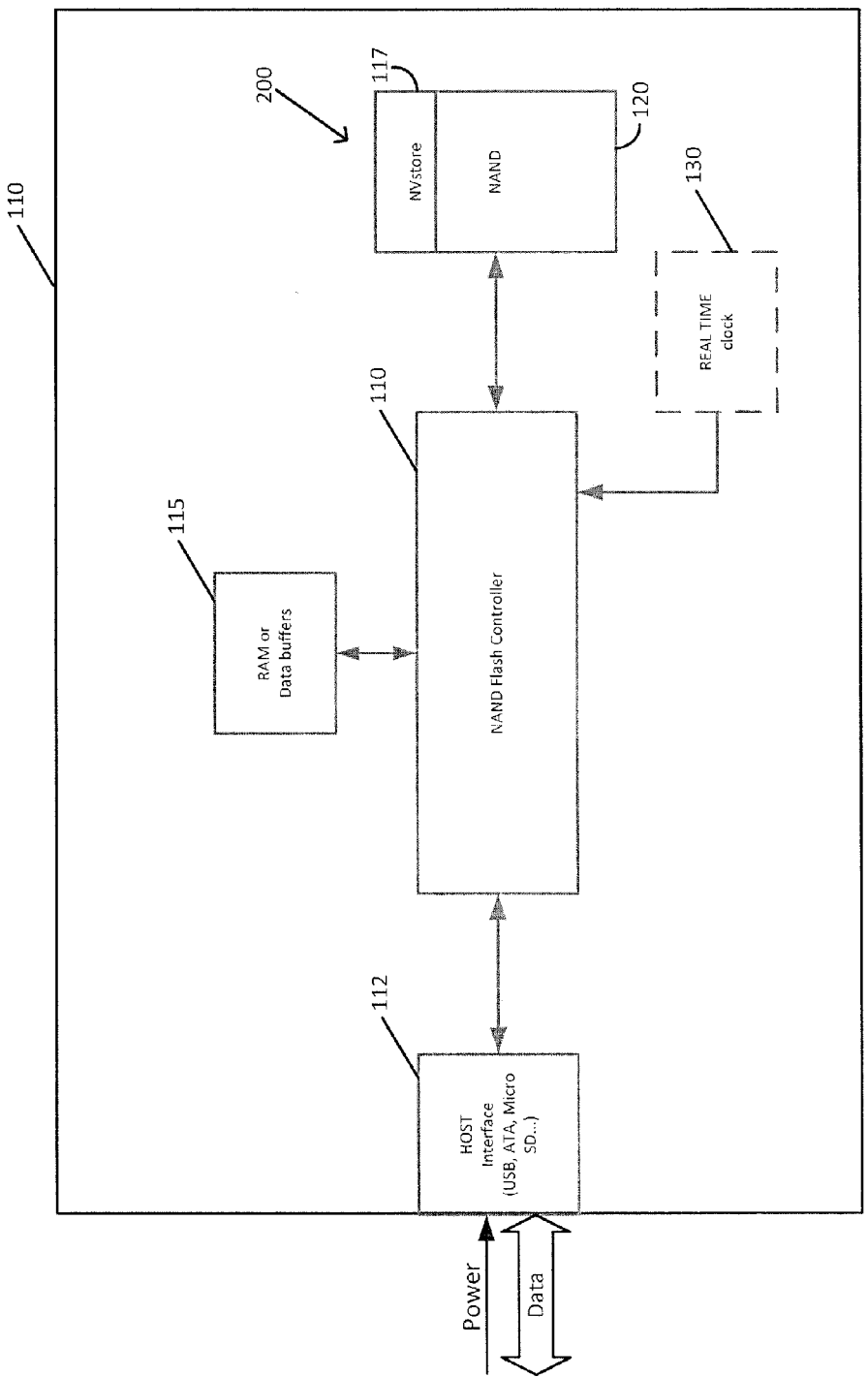
FIG. 2 is a block diagram of an alternate storage device of an embodiment.

Returning to FIG. 1, the storage device 100 also comprises RAM or data buffers 115 to buffer data before it is to be written to the non-volatile memory 120 and/or after it is read from the non-volatile memory 120. The storage device 100 also comprise a non-volatile storage unit 117 used as a small-storage device (e.g., to store state information, as discussed below), whereas the non-volatile memory 120 would be used as a mass storage device. While the non-volatile storage unit 117 can be separate from the main non-volatile memory 120, as in FIG. 1, the non-volatile storage unit 117 can be part of the same memory die 200 as the non-volatile memory 120, as in FIG. 2. In this alternative, it may be advantageous for the non-volatile store 117 to have some redundancy or better retention characteristics than the main NAND memory 120. his could be done by using SLC mode memory operations, stronger ECC, and/or enhance parity protection. As the non-volatile store 117 would not be written as often as main NAND memory 120, the non-volatile store 117 can be configured with test modes for the best retention, trading off retention for endurance.

The storage device 100 may also contain an option real-time clock 130 with a battery to maintain time even when the storage device 100 is not supplied with power from a host. The storage device 100 can contain other components, which are not shown in FIG. 1 to simplify the drawing.

In the following embodiments, the controller 110 is said to be configured to perform various functions. It should be noted that the controller 110 can be configured in any suitable manner. For example, the controller 110 can take the form of a microprocessor or processor which executes computer-readable program code (e.g., software or firmware stored in the non-volatile memory 120 or other location). The controller 110 can also be configured to perform various functions by having a hardware implementation using, logic gates, switches, an application specific integrated circuit (ASIC), a programmable logic controller, and an embedded microcontroller, for example. So, the controller 110 can be configured with hardware and/or software to perform the various functions described below and shown in the flow charts. The below functionality can be configured into new storage devices during production or can be retrofitted into existing storage devices (e.g., via a firmware upgrade). If configured during manufacturing, an auto refresh rate programmed into the storage device 100 for a self-refresh operation can be set based on what NAND die the storage device 100 was manufactured with in order to address remnant die problems.

Figure 3:
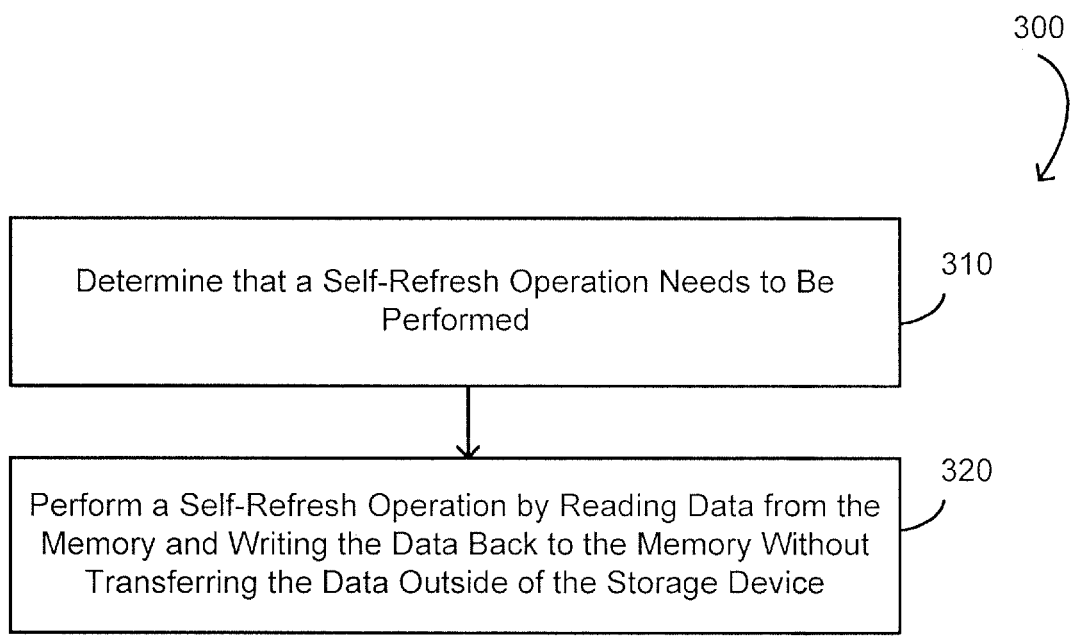
FIG. 3 is a flow chart of a method of an embodiment for performing a self-refresh operation.

Turning again to the drawings, FIG. 3 is a flow chart 300 of a method of an embodiment for performing a self-refresh operation. As shown in FIG. 3, the storage device 100 determines that a self-refresh operation needs to be performed (act 310). In response to determining that the self-refresh operation needs to be performed, the storage device 100 performs the self-refresh operation by reading data from the memory 120 and writing the data back to the memory 120 without transferring the data outside of the storage device 100 (act 320).

The storage device 100 can determine that a self-refresh operation needs to be performed in any suitable way. For example, in one embodiment, the storage device 100 determines that the self-refresh operation is needed by analyzing a time of a previous write of the data. This can be implemented, for example, by having a driver with firmware that interrogates the storage device 100 and decides if it is time to start a refresh operation (alternatively, the driver can include firmware that would trigger an interaction with the user to allow the user to allow the start of the refresh process or delay this process to another time). This example will be described in conjunction with the flow chart 400 in FIG. 4.

Figure 4:
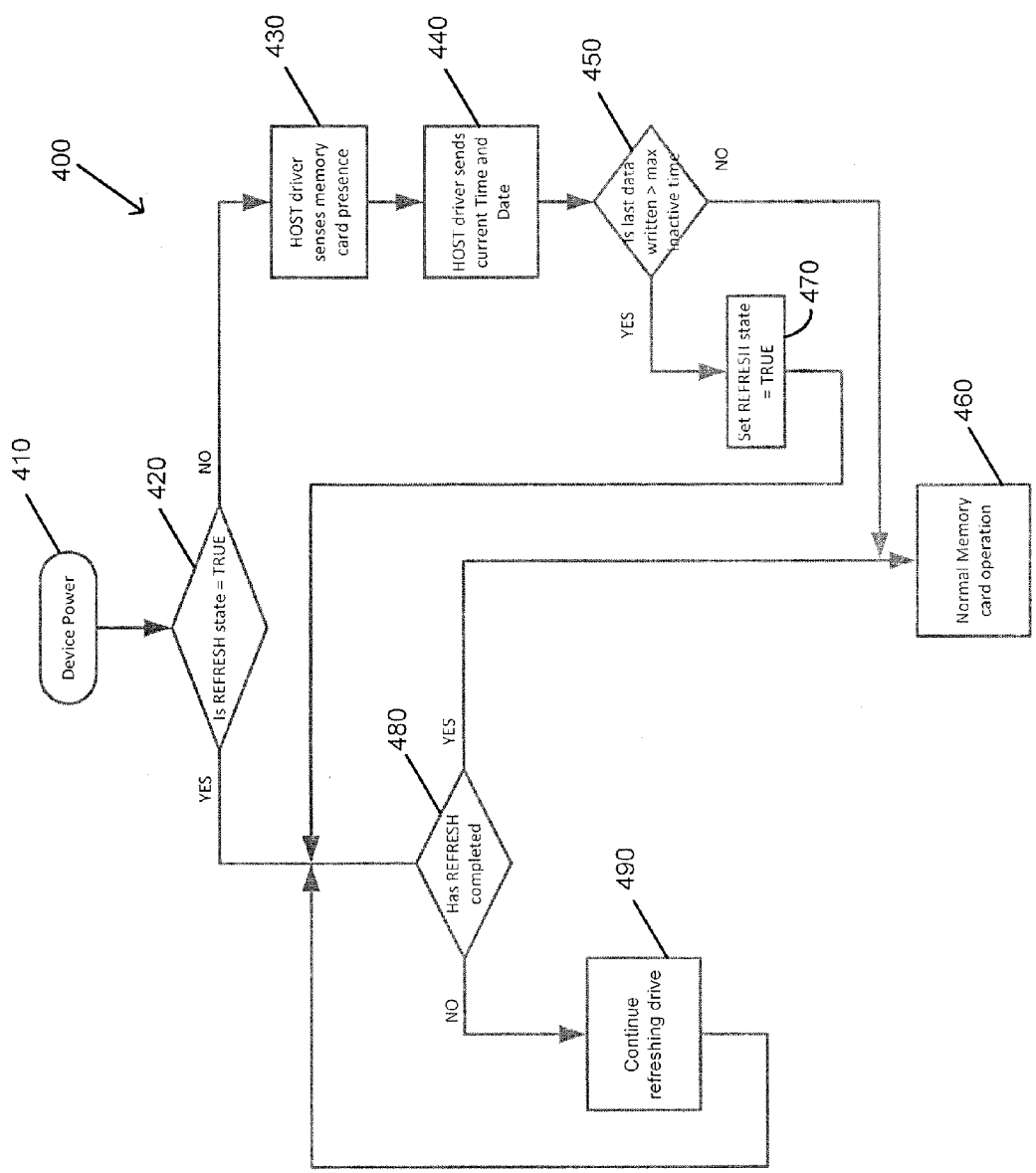
FIG. 4 is a flow chart of a method of an embodiment for determining that a self-refresh operation is needed.

As shown in FIG. 4, in this example, when the storage device 100 is powered up (act 410), the storage device 100 first checks to see if a stored refresh state variable is true (act 420). The storage device 100 can store a state of a self-refresh operation (e.g., in the non-volatile store 117), so the self-refresh operation can resume if interrupted. In other words, the state variable is set at a self-refresh trigger to allow the storage device 100 to remember it has to perform a self-refresh operation. In one embodiment, the refresh state variable will not be cleared until the refresh operation has completed. This allows the self-refresh operation to begin with one device and then be completed on another device (e.g., such as when a user plugs a USB drive into different hosts), without requiring either device to have knowledge of the refresh operation. So, if the storage device 100 is unplugged while a self-refresh operation is still in process, when the storage device 100 is powered up again, the storage device 100 checks the state variable, and the refresh operation can be picked up where is left off and continue until it completes.

If the stored refresh state variable is not true (there is no self-refresh operation in process) and the storage device 100 is connected with a host, the host senses the storage device's presence (act 430) and sends the current time and date to the storage device 100 (act 440). (Alternatively, if the storage device 100 has its own real-time clock 130, the storage device 100 can obtain the time from its clock 130 instead of from the host.) The storage device 100 then determines if the time the data was last written (e.g., from a time stamp on a file or from a last refresh date stored in the storage device 100, if a time stamp on a file does get updated when the file is refreshed) is greater than a maximum inactive time (act 450). If it isn't, a self-refresh operation is not needed, and the storage device 100 can proceed with its normal operations (act 460). However, if the last written time is greater than the maximum inactive time, the storage device sets the refresh state variable to true (act 470) and starts the self-refresh operation. The storage device 100 checks to see if the self-refresh operation is complete (act 480) and continues refreshing until it is (act 490).

Figure 5:
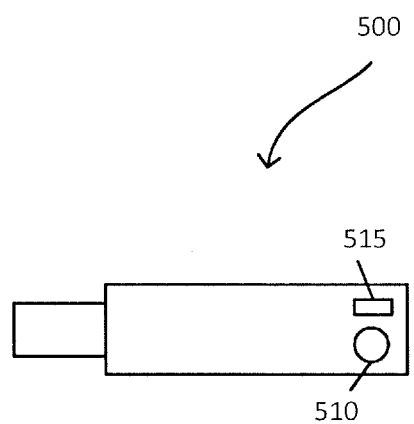
FIG. 5 is an illustration of a storage device of an embodiment with a user input element and status indicator.

There are other ways in which the storage device 100 can determine that a self-refresh operation is needed. In one embodiment, instead of the storage device 100 figuring out on its own that a self-refresh operation is needed, the storage device 100 can be commanded to performed a self-refresh operation. (Even though the refresh operation is performed in response to an external command, it is still a "self"-refresh operation because the data is read and written back to the memory 120 without sending the data outside of the storage device 100.) For example, the command can be generated by activation of a user input element on the storage device 100 (such as a button 510 on a USB drive (see FIG. 5)). Pushing a hardware button on the storage device 100 can trigger a one-time refresh of the storage device when it is plugged in. As another example, the command can be from a host in communication with the storage device 100. As one implementation of this, the host can present a user with a pop-up screen suggesting that the storage device 100 be self-refreshed. If the user agrees, an application on the host can send a command to the storage device 100 to trigger the self-refresh operation. As another example, the command can be received from a docking station 800 (see FIG. 8) after the storage device 100 is connected with the docking station. The docking station could come in the form of a USB power transformer (e.g., wall wart).

Just as the storage device 100 can determine that the self-refresh operation needs to be performed in any suitable way, the storage device 100 can also perform the self-refresh operation in any suitable way. For example, in one embodiment, the storage device 100 performs the self-refresh operation by reading all valid, written logical address in the memory 120. Because all valid, written logical address in the memory 120 are read, this embodiment refreshes data, such as important file indexes and meta data, that are normally not seen by the end user (and, thus, cannot be manually refreshed by the end user). Since all valid, written logical addresses are read in this embodiment, it may be preferred to use a TRIM operation to remove irrelevant written logical address locations from the VALID map, so they do not get rewritten during the self-refresh operation. That is, in this embodiment, if data at a given logical address space had not been written or had been trimmed, the data would not be read and rewritten.

It should be noted that the self-refresh operation does not have to preclude normal host activity. Self-refresh, once started, can be allowed to continue even if the host is continuing to use the device for read and write. A special case can be if the user requested a format action, as this action could reset the self-refresh state variable as the operation would no longer be required with the erasing of all the data.

Figure 6:
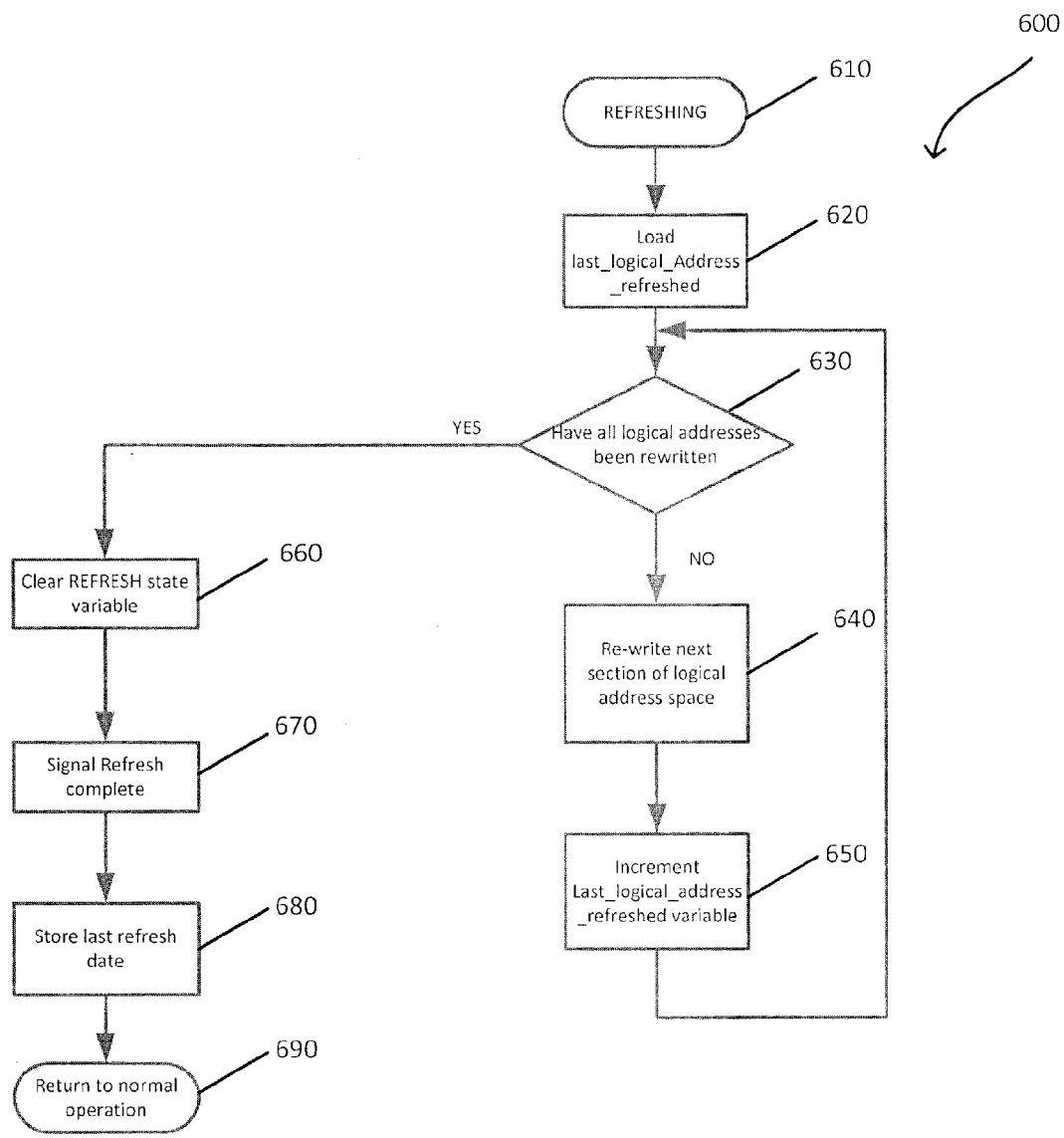
FIG. 6 is a flow chart of a method of an embodiment for performing a self-refresh operation.

This embodiment will be described in conjunction with the flow chart 600 in FIG. 6. As shown in FIG. 6, during a self-refresh operation (act 610), the storage device 100 loads the last_logical_Address_refreshed variable stored in the storage device 100 (e.g., in the non-volatile store 117) (act 620). The storage device 100 compares this address with the last valid, written logical address in the memory 120 to determine if all of the logical addresses have been rewritten in a self-refresh operation (act 630). If they haven't, the storage device 100 re-writes the next section of logical address space (act 640) and increments the last_logical_Address_refreshed variable (act 650). As mentioned above, this process of reading data out of the memory 120 and back into the memory 120 is performed without transferring the data out of the storage device 100. The RAM or data buffers 115 can be used to temporarily store the data during the moving process, or the memory 120 can be configured to move the data internally. The self-refresh operation can use the memory controller 110 to correct errors in the read data via an error correction code (ECC) decoder and rewrite the data with ECC correction capabilities.

This process continues until all the valid, written logical addresses have been re-written, at which time the refresh state variable is cleared (act 660), and a signal is generated indicating that the self-refresh operation is complete (act 670). The storage device 100 can also store the last refresh date, as this can be used a trigger for a future refresh, especially when a time stamp on a file does get updated when the file is refreshed, as discussed above (act 680). The storage device 100 then returns to its normal operations (act 690).

While the storage device 100 can write the data back to the same physical address that it was read from, the storage device 100 can write the data to a different physical address in the memory 120, which can provide several advantages. For example, memory cells typically have a limited number of times the memory cell can be programmed and erased ("program-erase cycles") before the memory cells can no longer reliably store data. When a storage device is used for long-term data storage, there may be many memory cells that have a large number of unused program-erase cycles. Accordingly, the storage device 100 can use underutilized capacity in the storage device 100 by writing the data back to a portion of the memory 120 that is less used than the portion where the data was read from. Choosing where to write the data can also result in defragmenting the memory 120, as illustrated in FIGS. 7A-7D.

Figure 7D:
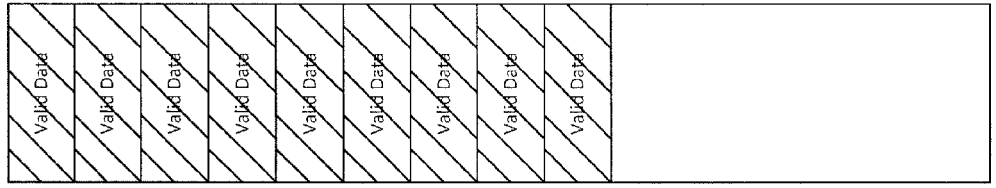
FIGS. 7A, 7B, 7C, and 7D are illustrations of logical and physical addresses before and after a self-refresh operation of an embodiment.
Figure 7C:
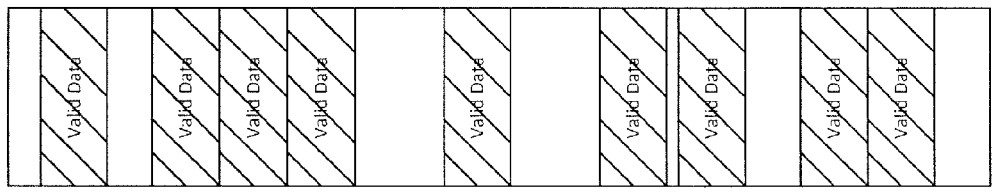
Figure 7B:
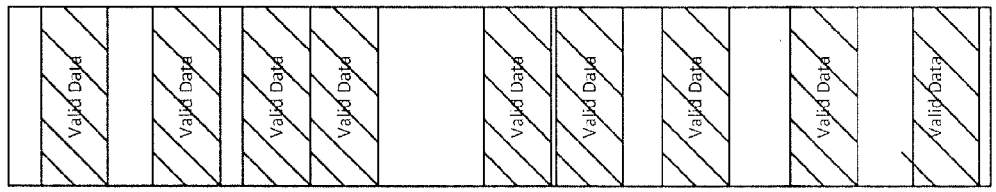
Figure 7A:
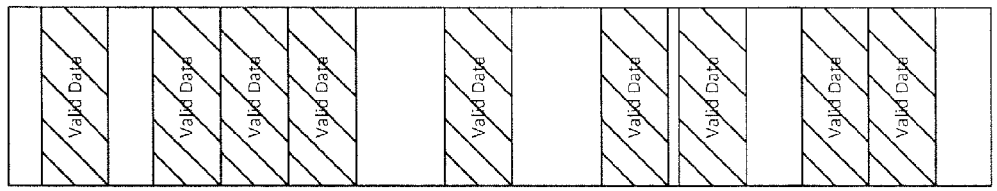

FIGS. 7A and 7B show the logical and physical locations, respectively, of data before a self-refresh operation. Only valid, written data is shown in FIG. 7A, and FIG. 7B shows that the data is stored in non-consecutive physical addresses in memory 120. After a refresh operation, the data is still stored in the same logical addresses (see FIG. 7C), however, the data can (but does not have to) be moved such that the data is not defragmented in the memory (see FIG. 7D). A logical-to-physical address map stored in the storage device 100 can be updated to associate the logical addresses with the physical addresses that store the data after the self-refresh operation.

There are many advantages associated with these embodiments. For example, because the self-refresh process is performed internally in the storage device 100, the data read from the memory 120 does not need to be transferred outside of the storage device 100. As such, these embodiments do not require data transfers between the storage device 100 and a host (thereby speeding-up the refresh operation), nor do they require special copy firmware on the host. This frees the host from the responsibility of performing the refresh operation and keeping the state of refresh, as the host would only need to provide power to the storage device 100. Further, devices that provide power but do not read/write data (such a USB power hub or docking station) can be used to provide the power needed for a self-refresh operation.

There are many alternatives that can be used with these embodiments. For example, instead of refreshing all of the valid, written logical block addresses, the storage device 100 can refresh only those files that are older than a threshold age. In this way, the self-refresh operation would be performed on a file-by-file basis (e.g., based on the file's timestamp) rather than on all of the data stored in the memory 120. In this alternative, the refresh algorithm operates at a file level instead of a low, logical-addressed sector level. If the refresh algorithm targets only data that is at least some predetermined age, it may be preferred to put a time stamp on the data that is updated when a refresh operation occurs. In that way, the date on a file can be used to compare against the refresh target time.

As another alternative, when the refresh operation processes all active logical address locations that have valid data, a log can be kept of any data that is no longer readable. In the event there is an error and the data is unreadable, the storage device 100 can provide an indicator to the user. For example, if the storage device 100 has a status indicator light 515 (e.g., LED) (see FIG. 5), the storage device 100 can blink the status indicator light with a special pattern other than for normal write operations or blink the status indicator light with a different color than for normal write operations. When the operation is completed without error, the status indicator light can go off but indicate normal, regular use. If an error occurred, the status indicator light can blink a pattern or display a color to indicate lost data. Additionally or alternatively, the storage device 100 can log the logical addresses that were not readable into an event log that can be read by a device driver and report the log to the end user (e.g., via an application running on a host computer). This would be helpful for storage devices that do not have a status indicator light.

Finally, as mentioned above, any type of memory can be used with these embodiments. Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two dimensional and three dimensional exemplary structures described but cover all relevant memory structures within the spirit and scope of the invention as described herein and as understood by one of skill in the art.

It is intended that the foregoing detailed description be understood as an illustration of selected forms that the invention can take and not as a definition of the invention. It is only the following claims, including all equivalents, that are intended to define the scope of the claimed invention. Finally, it should be noted that any aspect of any of the preferred embodiments described herein can be used alone or in combination with one another.

What is claimed is:

1. A method for performing a self-refresh operation in a storage device, the method comprising:
   performing the following in a storage device after the storage device is powered by a host, wherein the storage device has a non-volatile memory:
      determining whether to perform a self-refresh operation on data that was stored in the non-volatile memory before the storage device was powered by the host; and
      in response to determining to perform the self-refresh operation, performing the self-refresh operation internally in the storage device by reading the data from the non-volatile memory of the storage device and writing the data back to the non-volatile memory of the storage device, wherein the storage device only needs to receive power from the host to perform the self-refresh operation.

2. The method of claim 1 further comprising:
   storing a state of the self-refresh operation, so the self-refresh operation can resume if interrupted.

3. The method of claim 1, wherein the storage device determines whether to perform the self-refresh operation by analyzing a time of a previous write of the data.

4. The method of claim 1, wherein the storage device determines to perform the self-refresh operation in response to receiving a command to perform the self-refresh operation.

5. The method of claim 4, wherein the command is generated by activation of a user input element on the storage device.

6. The method of claim 4, wherein the command is received from the host.

7. The method of claim 6, wherein the host is a docking station.

8. The method of claim 1, wherein data is read from all valid, written logical addresses in the non-volatile memory.

9. The method of claim 1, wherein only data that is older than a threshold age is read from the non-volatile memory.

10. A method for performing a self-refresh operation in a storage device, the method comprising:
    performing the following in a storage device having a memory:
       determining that a self-refresh operation needs to be performed; and
       in response to determining that the self-refresh operation needs to be performed, performing the self-refresh operation by reading data from the memory and writing the data back to the memory without transferring the data outside of the storage device;
    wherein the data is written back to a portion of the memory that is less used than the portion where the data was read from.

11. The method of claim 1 further comprising providing a status of the self-refresh operation.

12. The method of claim 1, wherein the storage device comprises a controller on the same substrate as the memory.

13. The method of claim 1, wherein the storage device is removably connectable to the host.

14. The method of claim 13, wherein the storage device is a universal serial bus (USB) drive.

15. The method of claim 1, wherein the storage device is embedded in the host.

16. A storage device comprising:
    a non-volatile memory; and
    a controller in communication with the non-volatile memory, wherein the controller is configured to perform the following after the storage device is powered by a host:
       determine whether to perform a self-refresh operation on data that was stored in the non-volatile memory before the storage device was powered by the host; and
       in response to determining to perform the self-refresh operation, perform the self-refresh operation internally in the storage device by reading the data from the non-volatile memory of the storage device and writing the data back to the non-volatile memory of the storage device, wherein the storage device only needs to receive power from the host to perform the self-refresh operation.

17. The storage device of claim 16, wherein the controller is further configured to store a state of the self-refresh operation, so the self-refresh operation can resume if interrupted.

18. The storage device of claim 16, wherein the controller is configured to determine whether to perform the self-refresh operation by analyzing a time of a previous write of the data.

19. The storage device of claim 16, wherein the controller determines to perform the self-refresh operation in response to receiving a command to perform the self-refresh operation.

20. The storage device of claim 19, wherein the command is generated by activation of a user input element on the storage device.

21. The storage device of claim 19, wherein the command is received from the host.

22. The storage device of claim 19, wherein the host is a docking station.

23. The storage device of claim 16, wherein data is read from all valid, written logical addresses in the non-volatile memory.

24. The storage device of claim 16, wherein only data that is older than a threshold age is read from the non-volatile memory.

25. A storage device comprising:
    a memory; and a controller in communication with the memory, wherein the controller is configured to:
  determine that a self-refresh operation needs to be performed; and
  in response to determining that the self-refresh operation needs to be performed, perform the self-refresh operation by reading data from the memory and writing the data back to the memory without transferring the data outside of the storage device;
wherein the data is written back to a portion of the memory that is less used than the portion where the data was read from.

26. The storage device of claim 16, wherein the controller is further configured to provide a status of the self-refresh operation.

27. The storage device of claim 16, wherein the controller is on the same substrate as the memory.

28. The storage device of claim 16, wherein the storage device is removably connectable to the host.

29. The storage device of claim 28, wherein the storage device is a universal serial bus (USB) drive.

30. The storage device of claim 16, wherein the storage device is embedded in the host.

* * * * *